United States Patent [19]

Rignall

[11] Patent Number: 4,881,591
[45] Date of Patent: Nov. 21, 1989

[54] OVEN FOR THE BURN-IN OF INTEGRATED CIRCUITS

[75] Inventor: Michael W. Rignall, Dursley, Great Britain

[73] Assignee: Sharetree Limited, Stroud, England

[21] Appl. No.: 53,107

[22] Filed: May 21, 1987

[51] Int. Cl.$^4$ .................. F25B 29/00; G01R 15/12
[52] U.S. Cl. .................................. 165/26; 165/27; 165/61; 165/63; 165/64; 364/557; 324/73 R; 324/73 PC; 324/158 R; 324/158 F; 219/494; 219/497; 219/210
[58] Field of Search .................. 165/61, 63, 64, 26, 165/48.1, 30, 27; 324/158 F, 73 PC, 158 D, 158 R, 73 R; 364/557; 219/494, 497, 210

[56] References Cited

U.S. PATENT DOCUMENTS

| | | | |
|---|---|---|---|
| 3,143,167 | 8/1964 | Vieth | 165/27 |
| 3,360,032 | 12/1967 | Sherwood | 165/39 |
| 3,724,536 | 3/1973 | Baxter | 165/27 |
| 3,842,346 | 10/1974 | Bobbitt | 324/158 F |
| 4,145,620 | 3/1979 | Dice | 324/73 PC |
| 4,572,283 | 2/1986 | Vander Schaaf | 165/61 |
| 4,573,011 | 2/1986 | Rochat et al. | 324/158 F |
| 4,695,707 | 9/1987 | Young | 324/73 PC |
| 4,734,872 | 3/1988 | Eager et al. | 364/557 |

FOREIGN PATENT DOCUMENTS

| | | | |
|---|---|---|---|
| 0069592 | 1/1983 | European Pat. Off. | |
| 3037192 | 5/1982 | Fed. Rep. of Germany | 324/158 R |
| 0155375 | 9/1983 | Japan | 324/158 R |
| 0089570 | 5/1986 | Japan | 324/158 R |

OTHER PUBLICATIONS

IBM Technical Disclosure Bulletin, Module Thermal Test Chamber, vol. 24, No. 9, Feb. 1982, pp. 4650-4651.

*Primary Examiner*—John F. Ford
*Attorney, Agent, or Firm*—Grant L. Hubbard

[57] ABSTRACT

Over for the burn-in of integrated circuits (12), comprising: a chamber (B) for receiving such circuits (12); first means (4), for heating such integrated circuits (12) in the chamber (B) with the circuits (12) fed with supply voltages; and control means for controlling the first means (4), including a computer (15) for monitoring power consumed by the circuits (12), the computer (15) being capable of storing information concerning the number of said circuits (12) and being adapted to provide from said power, a signal dependent on the mean power dissipation of the circuits (12): and in which oven the control means controls the heating of the circuits (12) in dependence on said signal. Also disclosed is an oven for the burn-in of integrated circuits (12), the oven comprising: a plurality of separate chambers (B) for receiving such circuits (12) to be burned-in with the circuits (12) fed with supply voltages; first means (4) for heating separately each of the chambers; and second means (6) for cooling separately each of the chambers with its circuits (12) therein, after they have been burned-in and with the circuits (12) still being fed supply voltages.

12 Claims, 3 Drawing Sheets

OVEN FOR THE BURN-IN OF INTEGRATED CIRCUITS

After the manufacture of integrated circuits, it is common for them to undergo a testing process called "burn-in" by being subjected to an elevated temperature in a chamber of an oven with operating supply and control voltages applied to the circuits.

Two problems associated with known burn-in apparatus and how attempts have been made to overcome them are as follows:

1. When certain integrated circuits are burned-in, if the control and supply voltages are removed before the temperature has reduced to ambient from the high temperature at which the burn-in took place, any induced failures may begin to recover and negate the effect of the burn-in process. To prevent this taking place, it is necessary for the supplies to be maintained to a burn-in assembly until ambient temperature is reached, this being known as cooling under bias.

This may be achieved in several ways. Firstly the boards carrying the integrated circuits (the burn-in boards) may be removed from their supplies for a duration of up to 1 minute and plugged into another power supply in a cooling atmosphere. This, however, is now being frowned upon by many users—the time being considered far too long. Secondly, a burn-in board may be ejected into the atmosphere, but this means that, with a single common chamber for all the boards, the gap that is left must be resealed and the supplies must be maintained through either flexible cables, which are prone to wear, or through a sliding contact system which may be inherently unreliable.

2. Most burn-in chambers allow either one temperature zone or at best four zones where different temperatures may be set for different kinds of integrated circuits.

To explain why the latter is necessary we may consider two types of integrated circuit in the same package.

Typically, a dual-in-line (DIL) package has a thermal resistance of 100° C./W, that is to say for each watt of dissipation in the circuit, the junction temperature (silicon chip temperature) will rise by 100° C.

Since burn-in is an accelerated chemical reaction, it follows that this temperature should be precisely controlled.

If we now consider two devices:

(a) CMOS gate with a dissipation of 1 mW;

(b) 256 K DRAM with a dissipation of 55 mW; applying a figure of 100° C./W, we can see that the silicon chip temperature will be at the chamber temperature, plus an additional factor as follows:

(a) Silicon temperature=Oven temperature (T oven)+(100×0.001)=T oven+0.1° C.

(b) Silicon temperature=T oven+(100×0.500)=T oven+50° C.

This illustrates the problem, showing, by way of example, a possible 50° C. temperature difference between two integrated circuit types in the same package and demonstrates the need for precise and specific temperature control of each burn-in board, for each integrated circuit device being burned-in.

According to one aspect of the present invention, there is provided an oven for the burn-in of integrated circuits, comprising: a chamber for receiving such circuits; first means, for heating such integrated circuits in the chamber with the circuits fed with supply voltages; and control means for controlling the first means, including a computer for monitoring power consumed by the circuits, the computer being capable of storing information concerning the number of said circuits and being adapted to provide, from said power, a signal dependent on the mean power dissipation of the circuits: and in which oven the control means controls the heating of the circuits in dependence on said signal.

According to a second aspect of the present invention, there is provided an oven for the burn-in of integrated circuits, the oven comprising: a plurality of separate chambers for receiving such circuits to be burned-in with the circuits fed with supply voltages; first means for heating separately each of the chambers; and second means for cooling separately each of the chambers with its circuits therein, after they have been burned-in and with the circuits still being fed with supply voltages.

The present invention will now be described, by way of example, with reference to the accompanying drawings, in which.

The burn-in oven to be described fulfills two important improvements, the first being the ability to cool individual burn-in boards under bias without moving parts, the second being the ability to be able to control individually junction temperatures of integrated circuits being burned-in.

Figure 1:
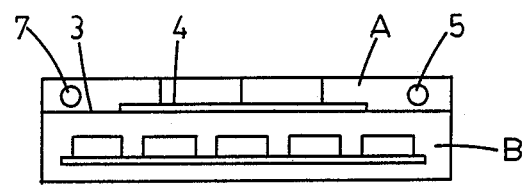
FIGS. 1, 2 and 3 show end, side and plan views of an individual burn-in assembly.
Figure 4:
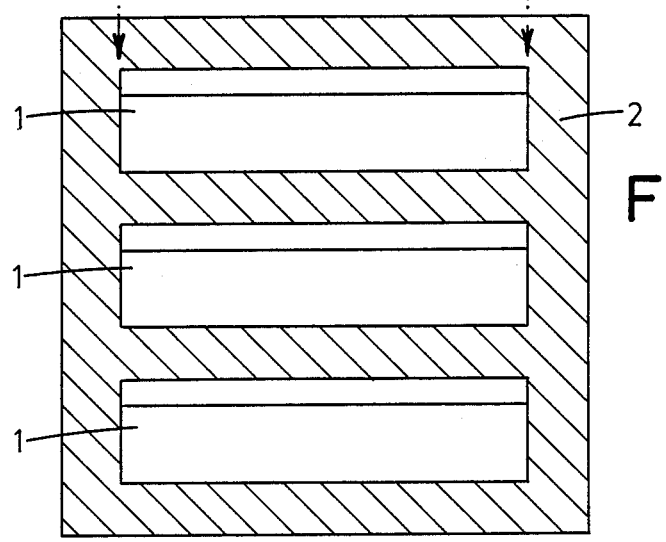
FIG. 4 shows from the front the shape of an oven incorporating such assemblies.
Figure 2:
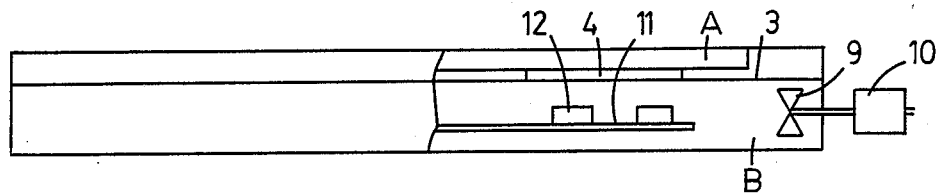
Figure 3:
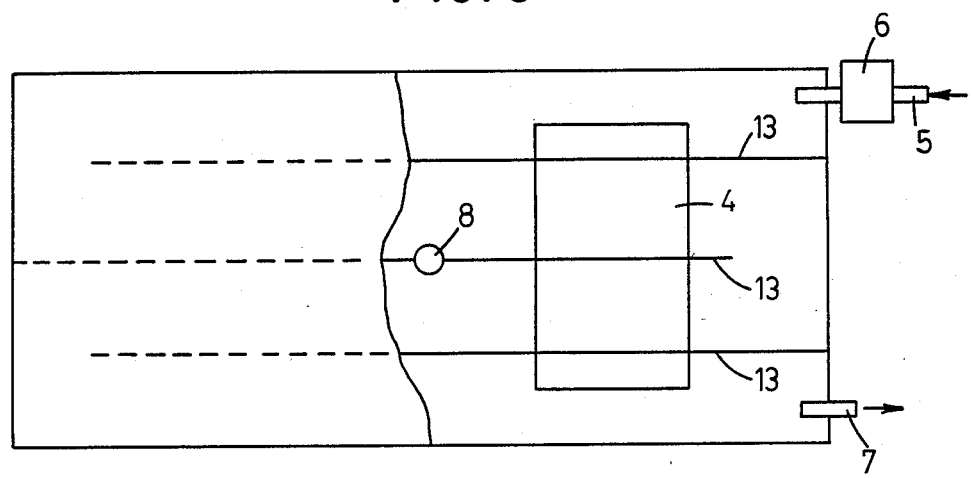

Referring to FIGS. 1 to 4 of the accompanying drawings, an oven for the burn-in of integrated circuits comprises a plurality of individual chambers 1 lagged by thermal insulation 2, in each of which chambers is received a respective burn-in board heater assembly as shown by FIGS. 1, 2 and 3. Each burn-in board heater assembly comprises: an upper sealed chamber A; a lower sealed chamber B (the chamber A and B being separated by thermally conductive interface surface 3); a series of highly thermally conductive, e.g. aluminum or copper, electrically energised heater plates 4 (only one being shown) on the surface 3; a cooling fluid inlet 5 communicating with the chamber A via a control valve 6, a cooling fluid exhaust outlet 7 from the chamber A; a fan 9 in the chamber B driven by a motor 10; and cooling fluid baffles 13 in the chamber A. In use, the chamber B receives a burn-in board 11 carrying integrated circuts 12 under test.

The chambers A and B are sealed from each other because a nitrogen atmosphere may be admitted to chamber B to prevent tarnishing of the contacts during burn-in, whilst the coolant fluid which may be air or, under certain circumstances, a liquid is admitted into Chamber A and the two must not mix. The interface surface 3 controls the heat flow between chamber A and B, the heaters 4 being positioned to provide an isothermal plane whose temperature may be controlled by a separate system (see below), the temperature being monitored by the temperature sensor 8.

The still air that will be generated in chamber B at the control temperatures is moved by fan 9 and normally this temperature will be maintained by the temperature sensor and associated system.

Figure 5:
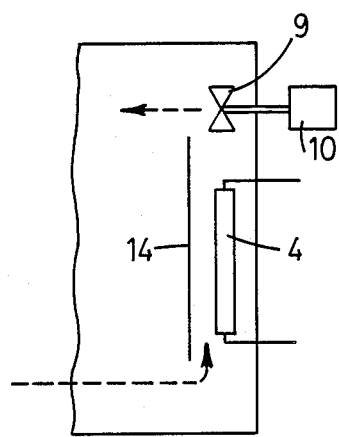
FIG. 5 is a view of a part of an alternative form of burn in assembly.

Alternatively, a heater 4 may be placed in the position shown in FIG. 5, in which reference numeral 14 denotes a direct radiation heat shield. If, however, the dissipation of the integrated circuits being burned-in exceeds that of the natural losses through the lagging, then coolant control valve 6 may be opened by the control system to admit cooling fluid which will flow over the surface 3 by means of the cooling fluid baffles 13. This fluid will then exit through the exhaust outlet 7 and the product of the specific heat and mass of cooling fluid will provide the necessary cooling function.

This cooling function, however, may also be employed at the end of the burn-in process to enable the particular burn-in assembly to be taken to approximately ambient temperature. In the first mode, that is maintained a burn-in temperature where excess heat must be removed, the heaters 4 would normally be off and a very short burst of cooling fluid would be admitted, the integrating function of the temperature being taken care of by the mass of the assembly walls and interface surface 3. For the cooling under bias mode, however, the operation is different. The system control (see below) would command a continuous on flow of cooling fluid, in which case the temperature would be taken to approximately ambient.

A burn-in assembly as described above relies upon the fact that it generates a signal from the temperature sensor 8 which is used to provide a control signal to effect feeding of power to the heaters 4 or to operate coolant control valve 6. Electronic circuitry to perform these functions will now be described with reference to FIG. 6. The system makes automatic allowances for variations in integrated circuit dissipation, though the system may also be adjusted manually to achieve the main benefits.

Figure 6:
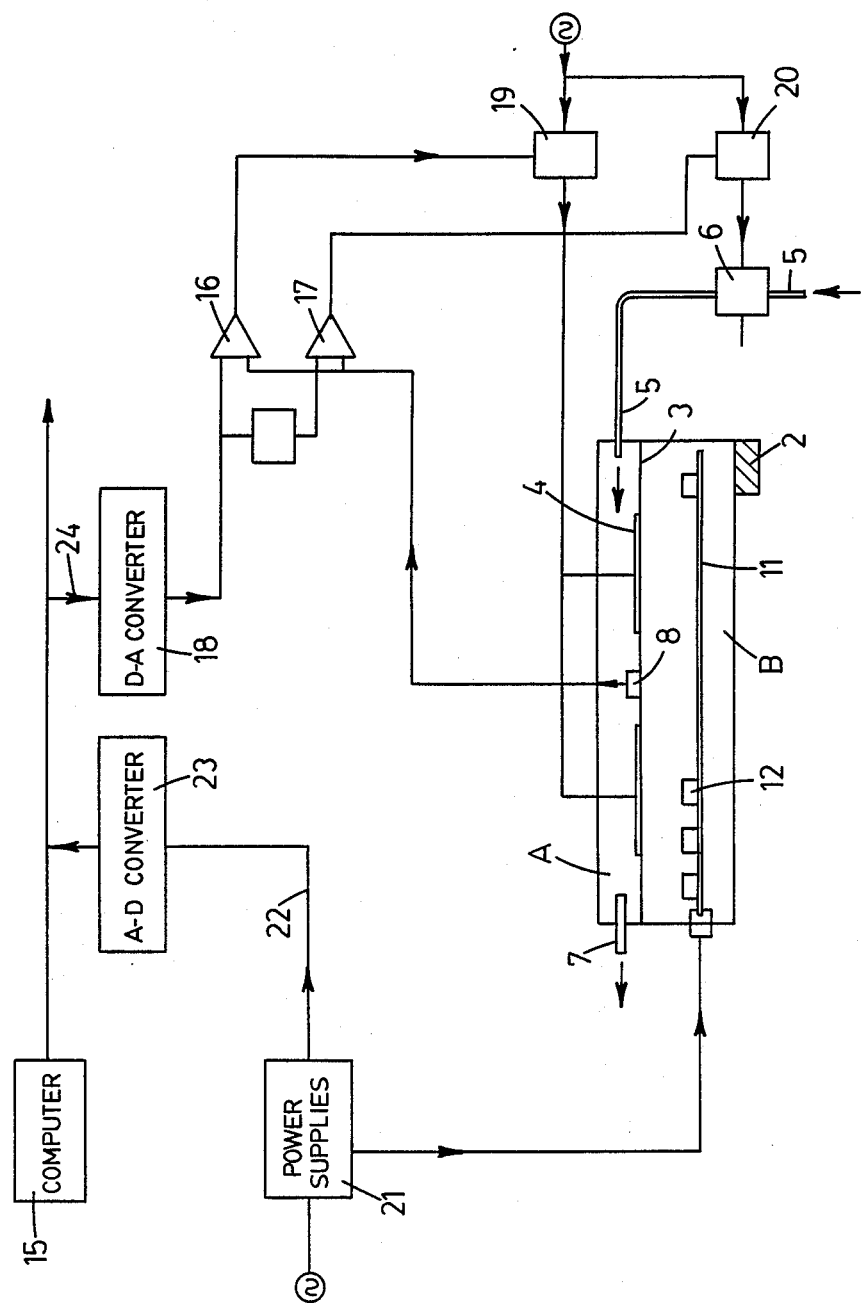
FIG. 6 shows electronic circuitry associated with each burn-in assembly.

The system shown in FIG. 6 comprises a computer 15 which assesses two comparators 16 and 17 via a digital to analogue (D-A) converter 18; a heater relay switch 19 controlled by the output of comparator 16; a control valve relay switch 20 controlled by the output of comparator 17, the comparators 16 and 17 receiving inputs from the temperature sensor 8; power supplies 21, which supply D.C. to the burn-in board, monitored voltage and current values being output from supplies 21 via lines denoted by reference numeral 22 to an analogue to digital (A-D) converter 23 whose output is fed to the computer 15.

The D-A converter 18 provides an analogue signal to drive comparators 16 and 17. The function of these comparators is such that a temperature sensitive signal derived from the temperature sensor 8 is compared with an aiming point or reference signal generated within the computer and outputted on to a signal bus 24 into the D-A converter 18. Comparator 16 controls heater switch 19, which may be either a conventional relay or more commonly a solid state relay with zero voltage switching. When the level defined by comparator 16 is reached, the heaters 4 are turned off. When the temperature exceeds this level by a difference of voltage V (an internally generated offset voltage), switch 20, which again may be either a conventional relay or a solid state relay, opens control valve 6, admitting the cooling fluid, which may be either air or a liquid. The resultant coolant flow sweeps over the surface of chamber A thus removing heat from the chamber B containing the burn-in board.

The control temperature, however, may be adjusted to conform to the burn-in requirements of the circuits under test and the reason for this variation may be explained with reference to the following two simple calculations (see also above). Since burn-in is primarily a chemical reaction, the temperature of the silicon chip itself must be controlled. If we consider a typical package of the dual in line type which will have a thermal resistance of approximately 100° C. per watt, it can be seen that a CMOS chip, whose dissipation is effectively zero during a burn-in period, will have a junction temperature almost exactly equal to that of the oven temperature. A second case, however, we must consider is a complex chip that may have a dissipation of, for example, 500 mW. In this case, the dissipation at the chip will raise the silicon junction area approximately 50° C. above that of the ambient air. We can thus see that if the chamber temperature is 150° C., then a CMOS device would be burned-in at a junction temperature of 150° C. The more complex chip, previously given as an example, would, however, be burned-in at a junction temperature of approximately 200° C. It can, therefore, be seen that the vital component that ought to be defined accurately is (in a standard burn-in chamber where all integrated circuits are subject to one temperature) not at all precisely controlled.

The function of the control system of FIG. 6 overcomes this problem by the following method. The computer 15 monitors the power supply to determine the power being fed into the burn-in board, and an operator will have already informed the computer how many devices are located on this board. The mean dissipation of each device may be therefore calculated by the computer with a knowledge of the device package thermal resistance. Thus, with the computer having the desired silicon chip temperature entered into it, can be seen that, quoting the example of the second device type, the burn-in temperature would be then set by the control system to 100° C. as opposed to the 150° C. required for the CMOS device. This simple case therefore illustrates that, with a knowledge of power in the number of devices, the junction temperature (the critical temperature in a burn-in procedure) may be controlled from one individual burn-in assembly to another, thus overcoming one of the major variables in the burn-in equation.

The comparators 16 and 17 are required to enable a small "deadband" to be achieved between the heaters turning off and the coolant being applied. This is standard in any closed loop controlled system. The coolant demand signal is therefore derived from changing the output potential of the D-A converter 18 being fed to comparator 17. In this manner, by setting the comparison voltage to represent approximately ambient temperature, an uninterrupted flow of coolant fluid will be admitted, thus fulfilling the cooling under bias requirement as described above.

What is claimed:

1. An oven for the burn-in of integrated circuits, comprising: a first chamber for receiving such circuits: first means for heating such integrated circuits in the first chamber; means for feeding such circuits with supply voltages; and control means for controlling the first means, including computer means for monitoring power consumed by the circuits, the computer means being capable of storing information concerning the number of said circuits and being adapted to provide, from said power, a signal dependent on the mean power dissipation of the circuits; and in which oven the control means controls the heating of the circuits in dependence on said signal.

2. An oven according to claim 1 comprising second means for cooling said first chamber and wherein said control means also controls said second means to effect a reduction in the temperature of said first chamber.

3. An oven according to claim 2 wherein said second means comprises a second chamber sealed off from and adjacent the first chamber, the second chamber comprising a thermally conductive division between the first and second chambers such that cooling fluid in said second chamber effects cooling of the first chamber.

4. An oven according to claim 3 wherein said first means is mounted in the second chamber and the first chamber is heated by thermal conduction through said division.

5. An oven according to claim 1 wherein said first means is mounted in the first chamber and further comprising a baffle to prevent direct radiation of heat onto said circuits and means for providing circulation of heat from said first means to said circuits.

6. An oven according to claim 2 wherein said signal provides a reference signal for comparator means which comparator means also receive a temperature signal indicative of the temperature in said first chamber the comparator means providing control signals for said first or second means to produce heating or cooling respectively to maintain a circuit semiconductor junction temperature substantially at a specified desired temperature by taking into account the warming effect of said junction by the respective calculated power dissipation.

7. An oven for the burn-in of integrated circuits, comprising a plurality of: first chambers for receiving such circuits; first means for heating such circuits in the first chambers; means for feeding such circuits with supply voltages; and control means for controlling the first means, including computer means for monitoring power consumed by the circuits, the computer means being capable of storing information concerning the number of said circuits and being adapted to provide, from said power, signals dependent on the mean power dissipation of the circuits; and in which oven the control means controls the heating of the circuits in dependence on said signals.

8. An oven according to claim 7 further comprising a plurality of second means for cooling said first chambers and wherein said control means also controls the second means to effect a reduction in the temperature of said first chambers.

9. An oven according to claim 8 wherein said second means comprises a plurality of second chambers sealed off from and adjacent the respective first chambers, the respective second chambers comprising a thermally conductive division between the respective first and second chambers such that cooling fluid in the respective second chambers effects cooling of the respective first chambers.

10. An oven according to claim 9 wherein the respective first means are mounted in the respective second chambers and the respective first chambers are heated by thermal conduction through the respective divisions.

11. An oven according to claim 7 wherein the respective first means are mounted in the respective first chambers and further comprise a plurality of baffles to prevent direct radiation of heat from the respective first means onto the respective circuits and means for providing circulation of heat from the first means to the respective circuits.

12. An oven according to claim 8 wherein said signals provide reference signals for comparator means which comparator means also receive temperature signals indicative of the temperatures in the respective first chambers the comparator means providing control signals for the respective first and second means to produce heating or cooling respectively to maintain respective circuit semiconductor junction temperatures substantially a specified desired temperatures by taking into account the warming effect at the respective junctions by the respective calculated power dissipation of such junctions.

* * * * *